United States Patent [19]
Mawst et al.

[11] Patent Number: 5,272,711
[45] Date of Patent: Dec. 21, 1993

[54] HIGH-POWER SEMICONDUCTOR LASER DIODE

[75] Inventors: Luke J. Mawst, Torrance; Dan Botez; Charles A. Zmudzinski, both of Redondo Beach, all of Calif.

[73] Assignee: TRW Inc., Redondo Beach, Calif.

[21] Appl. No.: 882,336

[22] Filed: May 12, 1992

[51] Int. Cl.$^5$ ............................................. H01S 3/19
[52] U.S. Cl. ....................................... 372/45; 372/46
[58] Field of Search .................................. 372/45, 46

[56] References Cited

U.S. PATENT DOCUMENTS 4,635,268  1/1987  Motegi et al. .................... 372/45
4,811,354  3/1989  Uomi et al. ........................ 372/46

*Primary Examiner*—Georgia Y. Epps
*Attorney, Agent, or Firm*—Sol L. Goldstein; James Steinberger

[57] ABSTRACT

A high-power semiconductor laser diode that employs a lateral antiresonant reflecting optical waveguide for generating a single-mode laser beam having an aperture spot size on the order of 4 to 8 microns. The lateral antiresonant reflecting optical waveguide is a negative-index waveguide or antiguide that operates in an antiresonance condition for the fundamental lateral mode, but not for the higher-order lateral modes. Consequently, the fundamental lateral mode is reflected by the lateral waveguide while the higher-order lateral modes are allowed to leak out. This provides strong discrimination between the fundamental lateral mode and the higher-order lateral modes in order to generate a single-mode laser beam having a large aperture spot size. The lateral waveguide also provides good lateral mode stability due to the large negative step in the waveguide index of refraction.

20 Claims, 3 Drawing Sheets

HIGH-POWER SEMICONDUCTOR LASER DIODE

BACKGROUND OF THE INVENTION

This invention relates generally to semiconductor laser diodes and, more particularly, to techniques for laterally confining the optical output of semiconductor laser diodes.

High-power laser light sources are required for a variety of optical systems, such as optoelectronic logic circuits, fiber-optic communication systems, and for optically pumping solid state lasers. Semiconductor laser diodes are particularly well suited as laser light sources for these optical systems because of their small size, high power efficiency, reliability, direct current modulation and operation at wavelengths having low transmission and dispersion losses in glass fiber optics.

One particular application for high-power semiconductor laser diodes is an optical pump source for erbium-doped optical amplifiers. These amplifiers are used in long-range fiber-optic communication systems and employ an erbium-doped fiber that is pumped at an absorption wavelength of 0.98 microns ($\mu$m). The erbium-doped fiber emits light at a wavelength of 1.55 microns, which has very low losses in silica-based optical fibers. However, optimal coupling between the semiconductor laser diode and the single-mode fiber requires that the laser diode operate at its fundamental transverse and lateral modes to produce a single-mode laser beam with an aperture spot size closely matching the 4 to 8 micron diameter of the optical fiber.

By way of general background, a semiconductor laser is a diode device in which a forward bias voltage is applied across an active layer and a pair of cladding layers. One cladding layer is an n-doped layer and the other is a p-doped layer so that excess electrons from the n-doped layer and excess holes from the p-doped layer are injected into the active layer by the bias voltage, where they recombine. At current levels above a threshold value, stimulated emission occurs and a monochromatic, highly-directional beam of light is emitted from the active layer. A resonant cavity is formed in the active layer at either end of the device by a highly-reflective surface and a partially-reflective surface through which the beam emerges. The cladding layers usually have a lower index of refraction than the active layer to provide a dielectric waveguide that transversely confines the laser light to the active layer. Active layers less than approximately 0.3 microns usually provide a dielectric waveguide in which only the fundamental transverse mode is supported.

Various techniques are typically employed to laterally confine the optical output of a semiconductor laser diode for operation at the fundamental lateral mode. One technique is gain guiding, which utilizes a narrow electrical contact to supply current to the device. The narrow electrical contact limits lasing in the active layer to the narrow region of the electrical contact. However, at high power levels, gain-guided laser diodes have strong instabilities and generate broad, highly-astigmatic double-peaked beams.

Another technique for laterally confining the optical output of a semiconductor laser diode is index guiding. Index guiding employs various dielectric waveguide structures to laterally confine the laser light. These waveguide structures are either positive-index guides, in which the index of refraction is higher in the region aligned with the laser element and lower in the regions surrounding the laser element, or negative-index guides, in which the index of refraction is lower in the region aligned with the laser element and higher in the regions surrounding the laser element. Positive-index guiding effectively traps light in the laser element, while negative-index guiding, or antiguiding, allows light to leak out of the lasing element. However, conventional index-guided laser diodes have aperture spot sizes on the order of 2 to 3 $\mu$m and operate at single-mode power levels of less than 200 mW, which is inadequate for pumping optical amplifiers for long range transmission. Accordingly, there has been a need for a semiconductor laser diode having an aperture spot size on the order of 4 to 8 microns that operates at higher power levels, preferably greater than 250 mW. The present invention clearly fulfills this need.

SUMMARY OF THE INVENTION

The present invention resides in a high-power semiconductor laser diode that employs a lateral antiresonant reflecting optical waveguide for generating a single-mode laser beam having an aperture spot size on the order of 4 to 8 microns ($\mu$m). The lateral antiresonant reflecting optical waveguide is a negative-index waveguide or antiguide that operates in an antiresonance condition for the fundamental lateral mode, but not for the higher-order lateral modes. Consequently, the fundamental lateral mode is reflected by the lateral waveguide while the higher-order lateral modes are allowed to leak out. This provides strong discrimination between the fundamental lateral mode and the higher-order lateral modes in order to generate a single-mode laser beam having a large aperture spot size. The lateral waveguide also provides good lateral mode stability due to the large negative step in the waveguide index of refraction.

In accordance with one embodiment of the present invention, a single-core, high-power semiconductor laser diode includes a substrate, an n-doped cladding layer, an active layer, a carrier confinement layer, an n-doped lateral antiresonant waveguide layer, a p-doped cladding layer, and an electrode layer. The lateral antiresonant waveguide layer includes a low refractive-index ($n_1$) core region surrounded by two high refractive-index ($n_2$) lateral waveguides and two low refractive-index ($n_1$) lateral waveguides. The high refractive-index lateral waveguides are separated by a distance $d_1$ to define a core width that is approximately equal to the desired aperture spot size of the output laser beam. The optimum width or lateral thickness $d_2$ of each high refractive-index lateral waveguide for antiresonance is approximately equal to an odd multiple of laterally-projected quarter wavelengths of the light that is guided in the high-index waveguide. This one-quarter lateral-wavelength thickness corresponds to the antiresonant condition of a Fabry-Perot cavity. The optimum width or lateral thickness $d_3$ of each low refractive-index lateral waveguide for antiresonance is approximately equal to an odd multiple of one-half of the core width $d_1$. Another embodiment of the present invention is a double-core, high-power semiconductor laser diode having a separate-confinement-heterostructure (SCH), double-quantum-well (DQW) active layer for improved carrier injection efficiency and a low threshold-current density.

It will be appreciated from the foregoing that the present invention represents a significant advance in the field of high-power semiconductor laser diodes. Other features and advantages of the present invention will become apparent from the following more detailed description, taken in conjunction with the accompanying drawings, which illustrate, by way of example, the principles of the invention.

DETAILED DESCRIPTION OF THE PREFERRED EMBODIMENTS

Figure 1:
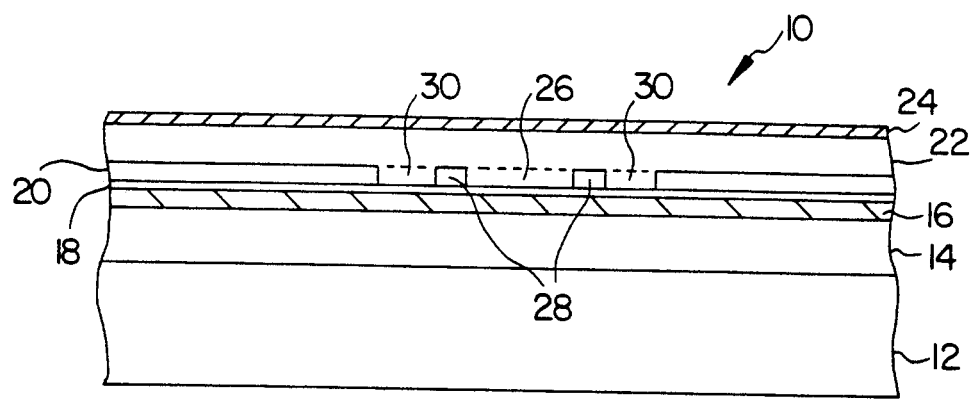
FIG. 1 is a fragmentary sectional view of a single-core, high-power semiconductor laser diode in accordance with one embodiment of the present invention.

As shown in the drawings for purposes of illustration, the present invention is embodied in a high-power semiconductor laser diode that employs a lateral antiresonant reflecting optical waveguide for generating a single-mode laser beam having an aperture spot size on the order of 4 to 8 microns ($\mu$m). The lateral antiresonant reflecting optical waveguide is a negative-index waveguide or antiguide that operates in an antiresonance condition for the fundamental lateral mode, but not for the higher-order lateral modes. Consequently, the fundamental lateral mode is reflected by the lateral waveguide while the higher-order lateral modes are allowed to leak out. This provides strong discrimination between the fundamental lateral mode and the higher-order lateral modes in order to generate a single-mode laser beam having a large aperture spot size. The lateral waveguide also provides good lateral mode stability due to the large negative step in the waveguide index of refraction.

Figure 3:
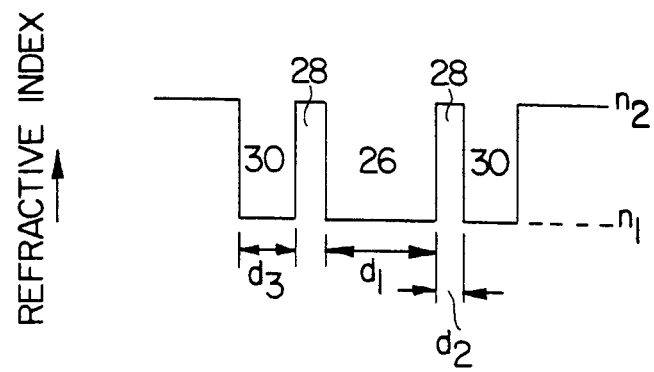
FIG. 3 is a graph of the lateral variation of the effective index of refraction of the single-core laser diode.

FIG. 1 illustrates a single-core, high-power semiconductor laser diode 10 in accordance with one embodiment of the present invention. The semiconductor laser diode 10 includes a substrate 12, an n-doped cladding layer 14, an active layer 16, a carrier confinement layer 18, an n-doped lateral antiresonant waveguide layer 20, a p-doped cladding layer 22, and an electrode layer 24. As shown in FIGS. 1 and 3, the lateral antiresonant waveguide layer 20 includes a low refractive-index ($n_1$) core region 26 surrounded by two high refractive-index ($n_2$) lateral waveguides 28 and two low refractive-index ($n_1$) lateral waveguides 30. The high refractive-index lateral waveguides 28 are separated by a distance $d_1$ to define a core width that is approximately equal to the desired aperture spot size of the output laser beam. The optimum width or lateral thickness $d_2$ of each high refractive-index lateral waveguide 28 for antiresonance is approximately equal to an odd multiple of laterally-projected quarter wavelengths of the light that is guided in the high-index waveguide. This one-quarter lateral-wavelength thickness corresponds to the antiresonant condition of a Fabry-Perot cavity. The optimum width or lateral thickness $d_3$ of each low refractive-index lateral waveguide 30 for antiresonance is approximately equal to an odd multiple of one-half of the core width $d_1$. Adjusting the composition of the various regions in the antiresonant waveguide layer 20 provides the desired variation in the lateral index of refraction for meeting these antiresonance conditions. U.S. Pat. No. 4,715,672 to Duguay et al., which is hereby incorporated by reference, provides further details regarding the requirements for meeting the antiresonance conditions.

Figure 2:
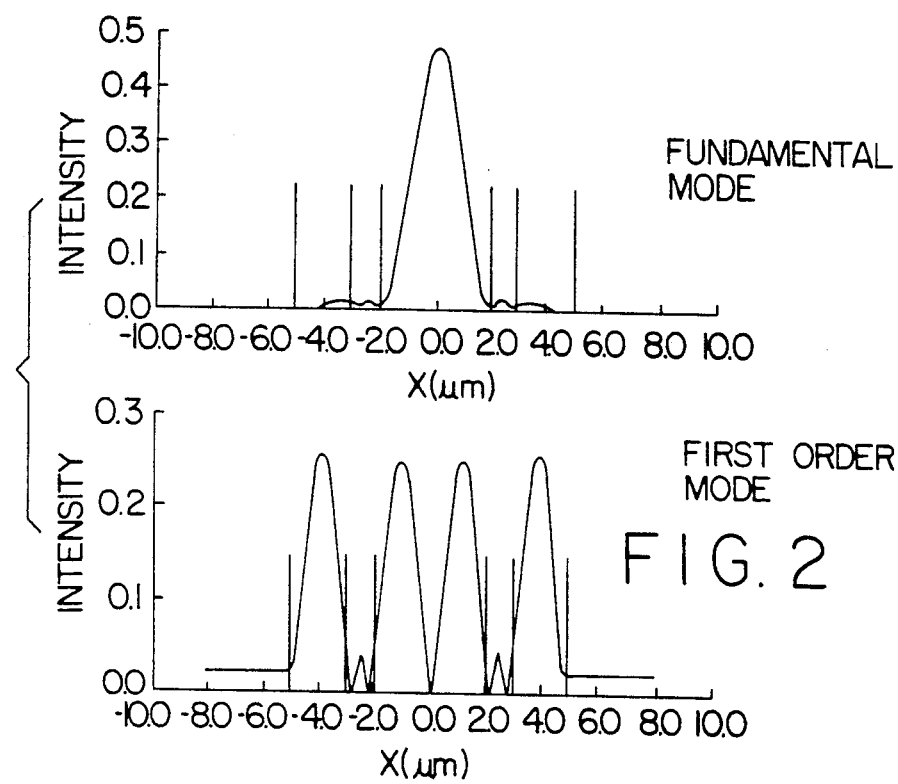
FIG. 2 is a near-field intensity profile of the optical output of the single-core laser diode.

As shown in FIG. 2, the lateral antiresonant reflecting optical waveguide operates in an antiresonance condition for the fundamental lateral mode, but not for the higher-order lateral modes. Consequently, the fundamental lateral mode is reflected by the lateral waveguide while the higher-order lateral modes are allowed to leak out. This provides strong discrimination between the fundamental lateral mode and the higher-order lateral modes in order to generate a single-mode beam having a large aperture spot size. A single-core semiconductor laser diode 10 having a lateral antiresonant optical waveguide with dimensions of $d_1 = 4$ microns, $d_2 = 1.5$ microns and $d_3 = 2$ microns produces a laser beam with an aperture spot size on the order of 4 microns.

Figure 4:
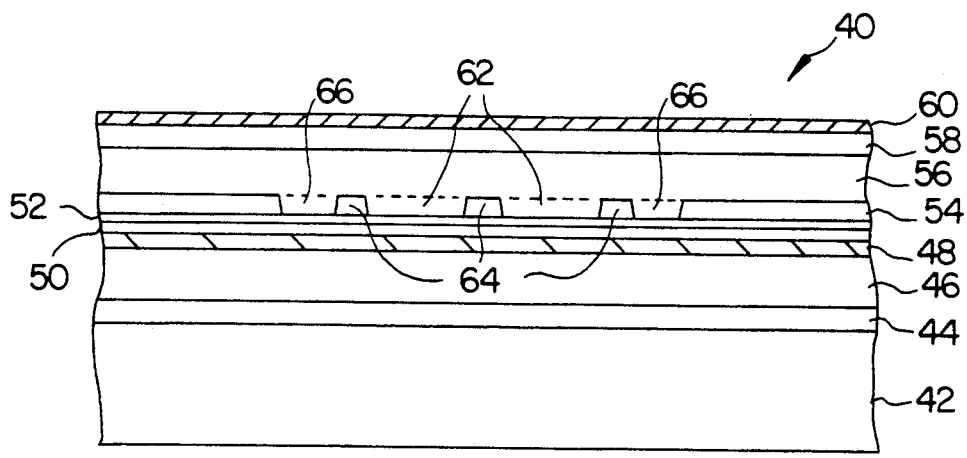
FIG. 4 is a fragmentary sectional view of a double-core, high-power semiconductor laser diode in accordance with another embodiment of the present invention.

FIG. 4 illustrates a double-core, high-power semiconductor laser diode 40 in accordance with another embodiment of the present invention. The double-core laser diode 40 has a separate-confinement-heterostructure (SCH), double-quantum-well (DQW) active layer for improved carrier injection efficiency and a low threshold-current density. The semiconductor laser diode 40 includes an n-doped GaAs substrate 42, an n-doped GaAs buffer layer 44, an n-doped $Al_{0.6}Ga_{0.4}As$ cladding layer 46, a separate-confinement-heterostructure (SCH), double-quantum-well (DQW) active layer 48, a p-doped $Al_{0.4}Ga_{0.6}As$ carrier confinement layer 50, a p-doped $Al_{0.2}Ga_{0.8}As$ layer 52, an n-doped $Al_xGa_{1-x}As$ lateral antiresonant waveguide layer 54, a p-doped $Al_{0.4}Ga_{0.6}As$ cladding layer 56, a $p^+$-doped GaAs ohmic contact layer 58, and a Ti-Pt-Au electrode layer 60. The n-doped GaAs layer 44 has a thickness of 1.0 micron, the n-doped $Al_{0.6}Ga_{0.4}As$ cladding layer 46 has a thickness of 1.5 $\mu$m, the p-doped $Al_{0.4}Ga_{0.6}As$ layer 50 has a thickness of 0.1 micron, the p-doped $Al_{0.2}Ga_{0.8}As$ layer 52 has a thickness of 0.05 $\mu$m, and the n-doped $Al_xGa_{1-x}As$ lateral antiresonant waveguide layer 54 has a thickness of 0.2 $\mu$m.

Figure 6:
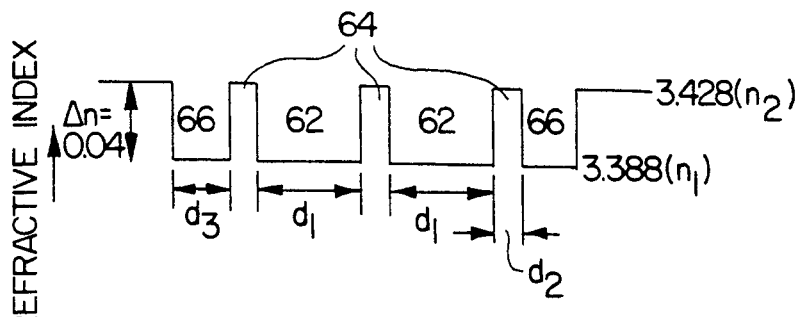
FIG. 6 is a graph of the lateral variation of the effective index of refraction of the double-core laser diode.

As shown in FIGS. 4 and 6, the lateral antiresonant waveguide layer 54 includes two low refractive-index ($n_1$) core regions 62 separated and surrounded by three high refractive-index ($n_2$) lateral waveguides 64. The high refractive-index lateral waveguides 64 are surrounded by two low refractive-index ($n_1$) lateral waveguides 66. The dimensions of the lateral antiresonant optical waveguide are $d_1 = 4$ microns, $d_2 = 1.5$ microns and $d_3 = 2$ microns, the same as the single-core semiconductor laser diode 10.

Figure 8:
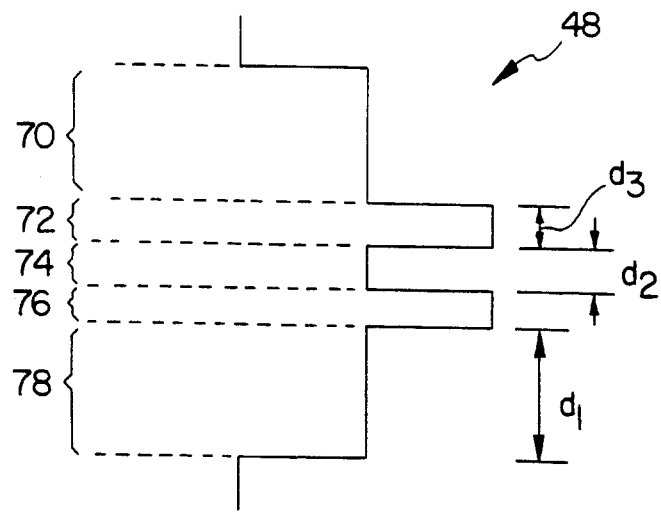
FIG. 8 is an enlarged, fragmentary sectional view of a separate-confinement-heterostructure (SCH), double-quantum-well (DQW) active layer.

As shown in FIG. 8, the SCH DQW active layer 48 includes a $Al_{0.2}Ga_{0.8}As$ first confinement layer 70, a GaAS first well layer 72, a $Al_{0.2}Ga_{0.8}As$ barrier layer 74, a GaAs second well layer 76 and a $Al_{0.2}Ga_{0.8}As$ second confinement layer 78. The confinement layers 70, 78 each have a thickness $d_1$ of 1000 Å, the barrier layer 74 has a thickness $d_2$ of 100 Å and the well layers 72, 76 each have a thickness $d_3$ of 100 Å.

Figure 5:
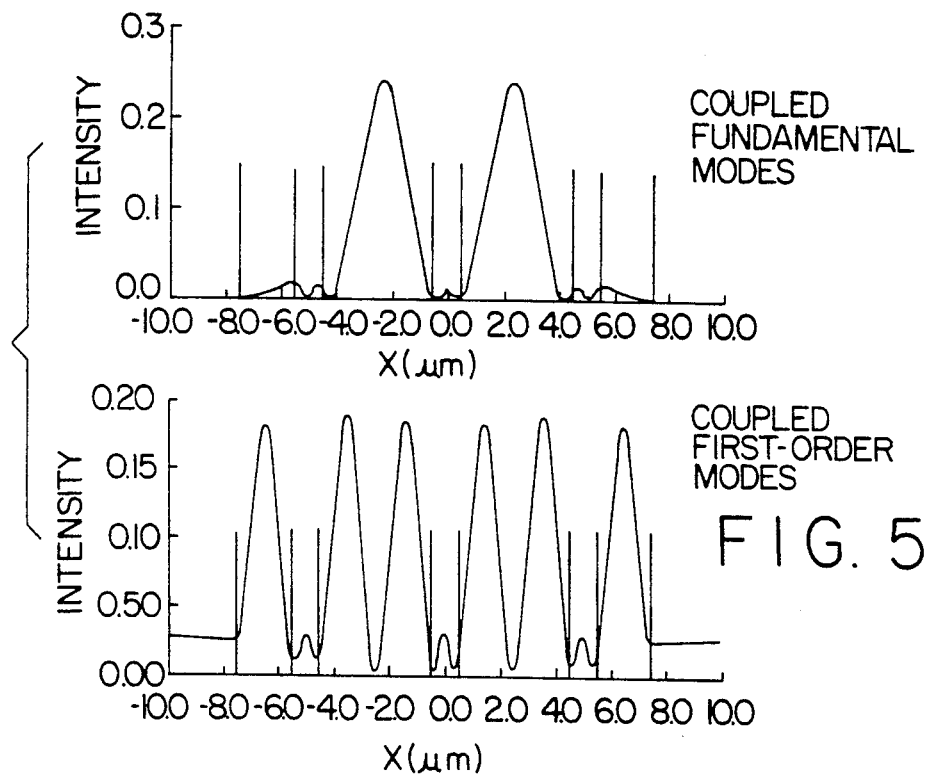
FIG. 5 is a near-field intensity profile of the optical output of the double-core laser diode.
Figure 7:
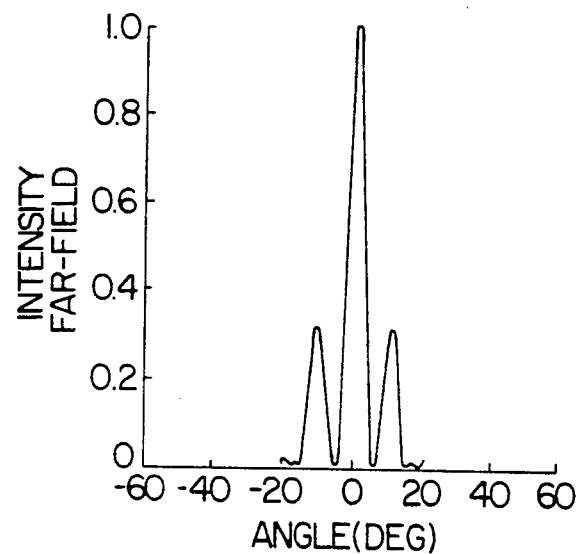
FIG. 7 is a far-field intensity profile of the optical output of the double-core laser diode.

FIG. 5 is a near-field intensity profile of the coupled fundamental and first-order lateral modes of the optical output of the double-core laser diode 40 and FIG. 7 is a far-field intensity profile of the optical output of the laser diode. A double-core semiconductor laser diode 40 having lateral antiresonant optical waveguide with dimensions of $d_1=4$ microns, $d_2=1.5$ microns and $d_3=2$ microns produces a laser beam having an aperture spot size on the order of 8 microns. The double-core laser diode 40 has a coupled fundamental mode loss of 2.5 cm$^{-1}$ and a coupled first-order mode loss of 65.0 cm$^{-1}$. A diffraction-limited beam is produced up to about 600 mW, with 60% power in the main lobe. A single-core laser diode having a SCH DQW active layer has a fundamental mode loss of 1.3 cm$^{-1}$ and a first-order mode loss of 72.0 cm$^{-1}$, for a higher-order mode discrimination of about 50. A diffraction-limited beam is produced up to about 450 mW, with approximately 80-90% of the output power in the main lobe.

The semiconductor laser diodes 10, 40 of the present invention are preferably fabricated using a conventional two-step metalorganic chemical vapor deposition (MOCVD) process. The single-core semiconductor laser diode 10 is also suitable for multiple cores of two or more and the double-core semiconductor laser diode 40 is suitable for multiple cores greater than two.

From the foregoing, it will be appreciated that the present invention represents a significant advance in the field of high-power semiconductor laser diodes. Although several preferred embodiments of the invention have been shown and described, it will be apparent that other adaptations and modifications can be made without departing from the spirit and scope of the invention. Accordingly, the invention is not to be limited, except as by the following claims.

We claim:

1. A high-power semiconductor laser diode comprising:
   a substrate;
   a first cladding layer formed on the substrate;
   an active layer formed on the first cladding layer;
   a carrier confinement layer formed on the active layer;
   a lateral antiresonant reflecting waveguide layer formed on the carrier confinement layer, the antiresonant waveguide layer having a low refractive-index core region surrounded by two high refractive-index lateral waveguides; and
   a second cladding layer formed on the antiresonant waveguide layer;
   wherein the lateral antiresonant reflecting waveguide operates in an antiresonance condition for the fundamental lateral mode but not for the higher-order lateral modes, thereby reflecting the fundamental lateral mode and allowing the higher-order lateral modes to leak out for strong discrimination between these two modes to produce a single-mode beam with a large aperture spot size.

2. The high-power semiconductor laser diode as set forth in claim 1, and further including two low refractive-index lateral waveguides surrounding the two high refractive-index lateral waveguides.

3. The high-power semiconductor laser diode as set forth in claim 2, wherein the high refractive-index lateral waveguides are separated by a distance $d_1$ to define a core width that is approximately equal to the aperture spot size of the output laser beam.

4. The high-power semiconductor laser diode as set forth in claim 3, wherein the optimum width $d_2$ of each high refractive-index lateral waveguide for antiresonance is approximately equal to an odd multiple of laterally-projected quarter wavelengths of the light that is guided in the high-index waveguide.

5. The high-power semiconductor laser diode as set forth in claim 4, wherein the optimum width $d_3$ of each low refractive-index lateral waveguide for antiresonance is approximately equal to an odd multiple of one-half of the core width $d_1$.

6. The high-power semiconductor laser diode as set forth in claim 5, wherein $d_1$ is approximately equal to 4 microns, $d_2$ is approximately equal to 1.5 microns and $d_3$ is approximately equal to 2.0 microns for producing a laser beam having an aperture spot size on the order of 4 microns.

7. The high-power semiconductor laser diode as set forth in claim 5, wherein the first cladding layer is an n-doped layer, the carrier confinement layer is a p-doped layer, the lateral antiresonant waveguide layer is an n-doped layer, and the second cladding layer is a p-doped layer.

8. The high-power semiconductor laser diode as set forth in claim 5, wherein the substrate is an n-doped GaAs substrate, the first cladding layer is an n-doped $Al_{0.6}Ga_{0.4}As$ layer, the carrier confinement layer is a p-doped $Al_{0.4}Ga_{0.6}As$ layer, the lateral antiresonant waveguide layer is an n-doped $Al_xGa_{1-x}As$ layer, and the second cladding layer is a p-doped $Al_{0.4}Ga_{0.6}As$ layer.

9. The high-power semiconductor laser diode as set forth in claim 1, wherein the active layer is a separate-confinement-heterostructure (SCH), double-quantum-well (DQW) active layer for improved carrier injection efficiency and a low threshold-current density.

10. The high-power semiconductor laser diode as set forth in claim 1, wherein the antiresonant waveguide layer includes two low refractive-index core regions separated and surrounded by three high refractive-index lateral waveguides.

11. The high-power semiconductor laser diode as set forth in claim 10, and further including two low refractive-index lateral waveguides surrounding the two outer high refractive-index lateral waveguides.

12. The high-power semiconductor laser diode as set forth in claim 11, wherein the high refractive-index lateral waveguides are separated by a distance $d_1$ to define a core width that is approximately equal to the aperture spot size of the output laser beam.

13. The high-power semiconductor laser diode as set forth in claim 12, wherein the optimum width $d_2$ of each high refractive-index lateral waveguide for antiresonance is approximately equal to an odd multiple of laterally-projected quarter wavelengths of the light that is guided in the high-index waveguide.

14. The high-power semiconductor laser diode as set forth in claim 13, wherein the optimum width $d_3$ of each low refractive-index lateral waveguide for antiresonance is approximately equal to an odd multiple of one-half of the core width $d_1$.

15. The high-power semiconductor laser diode as set forth in claim 14, wherein $d_1$ is approximately equal to 4 microns, $d_2$ is approximately equal to 1.5 microns and $d_3$ is approximately equal to 2.0 microns for producing a laser beam having an aperture spot size on the order of 8 microns.

16. The high-power semiconductor laser diode as set forth in claim 14, wherein the first cladding layer is an n-doped layer, the carrier confinement layer is a p-doped layer, the lateral antiresonant waveguide layer is an n-doped layer, and the second cladding layer is a p-doped layer.

17. The high-power semiconductor laser diode as set forth in claim 14, wherein the substrate is an n-doped GaAs substrate, the first cladding layer is an n-doped $Al_{0.6}Ga_{0.4}As$ layer, the carrier confinement layer is a p-doped $Al_{0.4}Ga_{0.6}As$ layer, the lateral antiresonant waveguide layer is an n-doped $Al_xGa_{1-x}As$ layer, and the second cladding layer is a p-doped $Al_{0.4}Ga_{0.6}As$ layer.

18. The high-power semiconductor laser diode as set forth in claim 10, wherein the active layer is a separate-confinement-heterostructure (SCH), double-quantum-well (DQW) active layer for improved carrier injection efficiency and a low threshold-current density.

19. A high-power semiconductor laser diode, comprising:

an active layer formed between two cladding layers; and a lateral antiresonant reflecting optical waveguide formed on the active layer, the antiresonant waveguide having a low refractive-index core region and a high refractive-index outer region;

wherein the lateral antiresonant reflecting waveguide operates in an antiresonance condition for the fundamental lateral mode but not for the higher-order lateral modes, thereby reflecting the fundamental lateral mode and allowing the higher-order lateral modes to leak out for strong discrimination between these two modes to produce a single-mode beam with a large aperture spot size.

20. The high-power semiconductor laser diode as set forth in claim 19, wherein the lateral antiresonant reflecting optical waveguide includes multiple low refractive-index core regions.

* * * * *